United States Patent
Tian et al.

(10) Patent No.: US 9,272,914 B2
(45) Date of Patent: Mar. 1, 2016

(54) -NH- TERMINATED SILICON SURFACE AND A METHOD FOR ITS PREPARATION

(75) Inventors: Fangyuan Tian, Newark, DE (US); Douglass F. Taber, Philadelphia, PA (US); Andrew V. Teplyakov, Newark, DE (US)

(73) Assignee: UNIVERSITY OF DELAWARE, Newark, DE (US)

( * ) Notice: Subject to any disclaimer, the term of this patent is extended or adjusted under 35 U.S.C. 154(b) by 265 days.

(21) Appl. No.: 13/989,479

(22) PCT Filed: Nov. 21, 2011

(86) PCT No.: PCT/US2011/061588
§ 371 (c)(1),
(2), (4) Date: Jul. 2, 2013

(87) PCT Pub. No.: WO2012/071296
PCT Pub. Date: May 31, 2012

(65) Prior Publication Data
US 2013/0287667 A1    Oct. 31, 2013

Related U.S. Application Data

(60) Provisional application No. 61/416,959, filed on Nov. 24, 2010.

(51) Int. Cl.
*C01B 33/00* (2006.01)
*H01L 21/306* (2006.01)
*B05D 3/10* (2006.01)
*B05D 1/36* (2006.01)

(52) U.S. Cl.
CPC .  *C01B 33/00* (2013.01); *B05D 1/36* (2013.01); *B05D 3/10* (2013.01); *H01L 21/306* (2013.01)

(58) Field of Classification Search
None
See application file for complete search history.

(56) References Cited

U.S. PATENT DOCUMENTS

| | | |
|---|---|---|
| 4,397,828 A | 8/1983 | Seyferth et al. |
| 5,001,090 A | 3/1991 | Schwark |
| 6,284,317 B1 | 9/2001 | Laibinis et al. |
| 6,403,382 B1 | 6/2002 | Zhu et al. |
| 6,569,979 B1 | 5/2003 | Strother et al. |
| 6,689,858 B2 | 2/2004 | Hamers et al. |
| 6,759,349 B2 | 7/2004 | Lewis et al. |
| 7,564,120 B2 | 7/2009 | Lewis et al. |

OTHER PUBLICATIONS

Cho et al, "Temperature-dependent adsorption and dissociation behaviors of NH3 on Si(111)7×7: A high-resolution core-level photoemission study," (2006) Physical Review B 73, pp. 115328-1 to 115328-6.*
Lin et al, "The structural and optical properties of a-SiNx:H prepared by plasma-enhanced chemical-vapor deposition," (1992) Journal of Applied Physics 72, pp. 5474-5482.*
Min Dai et al.; "Nitrogen Interaction with Hydrogen-Terminated Silicon Surfaces at the Atomic Scale"; Nature Materials, vol. 8, pp. 825-830, Oct. 2009.
International Search Report for Application No. PCT/US2011/061588, Dated Jul. 18, 2012.

(Continued)

*Primary Examiner* — Anthony J Zimmer
*Assistant Examiner* — Justin Bova
(74) *Attorney, Agent, or Firm* — RatnerPrestia

(57) ABSTRACT

A uniform Si—NH—Si terminated Si(111) surface is formed by contacting a chlorine-terminated silicon surface with ammonia and a solvent such as an ether.

16 Claims, 2 Drawing Sheets

(56) References Cited

OTHER PUBLICATIONS

PCT International Preliminary Report on Patentability for Application No. PCT/US2011/061588, Dated Jun. 6, 2013.
Rivillon et al; "Chlorination of Hydrogen-Terminated Silicon (111) Surfaces"; J. Val. Sci Technol. A 23(4), Jul./Aug. 2005; © 2005 American Vacuum Society.
Bent, et al.; "Turning the Reactivity of Semiconductor Surfaces by Functionalization with Amines of Different Basicity" (Approved Oct. 5, 2010); PNAS Early Edition; www.pnas.org/cgi/doi/10.1073/pnas.1006656107.
Baik, et. al.; "Surface Reactions of Oxygen and Nitrogen During Hydroxyl- and Amine-Functionalization on the Chlorinated Si(001)2X1 Surface"; Journal of Korean Physical Society, vol. 59, No. 3, Sep. 2011, pp. 2263-2267.

* cited by examiner

-NH- TERMINATED SILICON SURFACE AND A METHOD FOR ITS PREPARATION

STATEMENT REGARDING FEDERAL FUNDING

This invention was made with United States government support under grant number CHE-06 50123 awarded by the National Science Foundation. The United States government has certain rights in the invention.

FIELD OF THE INVENTION

The invention pertains to silicon surfaces containing —NH— functionality as well as methods for obtaining such surfaces.

BACKGROUND OF THE INVENTION

For over a quarter of a century, a hydrogen-terminated Si(111) single crystalline surface has remained the gold standard as a starting point for silicon modification chemistry. Although such a surface, following its preparation, is susceptible to oxidation under ambient conditions, it has proven to be sufficiently stable for chemical transformations leading to a remarkably versatile set of linkages, including Si-Halogen, Si—C (in alkyls), and Si—O (in alkoxides). However, creating a well-defined and stable interface based on Si—N bonds has remained elusive. Despite the fact that treatment with azides, nitro compounds, and amines has been found to lead to the formation of surface Si—N, each of these modification schemes produces additional carbon- or oxygen-containing functional groups that in turn react with the surface itself, leaving contaminants that affect the interface properties for any further modification protocols. More importantly, these currently available approaches to the generation of Si—N surface species lead to a variety of products, making the design of uniform attachment schemes or contaminant-free interfaces with these surfaces as a starting point essentially impossible.

BRIEF SUMMARY OF THE INVENTION

One aspect of the invention provides a silicon material having a silicon surface (e.g., an Si(111) single crystalline surface), wherein the silicon surface contains Si—NH—Si functionality and is essentially free of carbon- and oxygen-containing contaminants.

Another aspect of the invention provides method for introducing —NH— functionality onto a silicon surface, comprising contacting a chlorinated silicon surface (e.g., a chlorinated Si(111) single crystalline surface) with ammonia and a solvent such as tetrahydrofuran.

DETAILED DESCRIPTION OF THE INVENTION

The silicon material utilized in the present invention may be in any suitable physical form, e.g., a silicon wafer.

Figure 1:
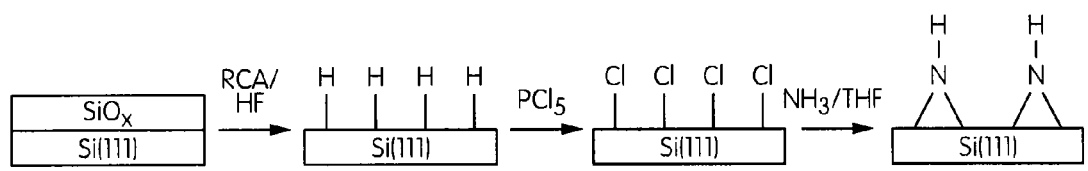
FIG. 1 represents in schematic form a preparation method in accordance with the invention that provides a uniform silicon surface terminated with Si—NH—Si functional groups.

A uniform Si—NH—Si terminated silicon surface may be prepared by chlorination of an Si—H terminated silicon surface to obtain an Si—Cl terminated silicon surface, which is then treated with ammonia. This synthetic approach is schematically represented in FIG. 1.

Preferred silicon substrates are porous silicon, particularly Si(100), or single crystal silicon, preferably Si(111) or Si(100). This includes both n- and p-type silicon, at any doping level. Porous silicon is particularly attractive, as its high surface area allows a high density of modification.

Hydrogen-terminated surfaces may be produced on a silicon substrate using various techniques, including plasma reduction, etching with HF, electrochemical etching, and etching with ammonium fluoride. A particularly good method is to treat silicon with a strong oxidizing agent, for example 3:1 $H_2SO_4$:30% $H_2O_2$, followed by etching with 40% ammonium fluoride, to produce a hydrogen-terminated surface. Any of the other methods known in the art to be effective in providing a hydrogen-terminated silicon surface may also be employed.

For example, an H-terminated Si(111) surface may first be prepared using a modified RCA cleaning procedure applied to a commercially available n-doped Si(111) single crystal surface covered with native oxide.

A chlorinated silicon surface may then be prepared according to known procedures involving treatment with chlorinating agents such as $PCl_5$, wherein H atoms on the silicon surface are replaced with Cl atoms. A free radical initiator such as a peroxide may also be present. Such chlorinations are typically carried out in the liquid phase (wet chemistry), but gas phase methods in the dark or using UV light in a low pressure chamber may also be utilized. Various chlorination procedures are described, for example, in Bansal et al., *J. Am. Chem. Soc.* 1996, 118, 7225-7226 and Rivillon et al., *J. Vac. Sci. Technol. A* 2005, 23, 1100-1106, each of which is incorporated herein by reference in its entirety for all purposes. Chlorine atoms may also be introduced onto a clean silicon surface using either vapor deposition under ultrahigh vacuum or by use of plasma etching methods. Generally speaking, it will be desirable to achieve a high degree of surface chlorination, i.e., to convert essentially all (e.g., at least 95% or at least 99%) of the Si—H groups on the surface to Si—Cl groups.

Conversion of the Si—Cl groups to Si—NH—Si groups may be achieved by contacting the chlorinated silicon surface with ammonia ($NH_3$). This conversion is facilitated by carrying out the contacting using a solvent for the ammonia, such that a liquid phase comprised of ammonia and solvent is contacted with the chlorinated silicon surface. If pure ammonia is used in its liquid state, it is difficult to avoid oxygen contamination from background impurities and it is also difficult to run a reaction at temperatures above the boiling point of ammonia (240° K. at atmospheric pressure), which can make the time required to achieve the desired conversion of Si—Cl to Si—NH—Si exceedingly long. In one embodiment of the invention, a saturated solution of ammonia in a solvent is utilized, although lower concentrations may also be suitable.

The solvent (or mixture of solvents) selected should be capable of solubilizing ammonia under the conditions at which the ammonia and solvent are contacted with the chlorinated silicon surface. The ammonia and solvent thus may form a solution, wherein the ammonia is dissolved in the solvent. In one embodiment, the solvent is an organic solvent or mixture of organic solvents. The solvent may be selected such that it is capable of dissolving a reasonably large concentration of ammonia under the conditions at which the contacting with the chlorinated silicon surface will be carried out (e.g., at least about 1% by weight or at least about 5% by weight ammonia is dissolved in the solvent). The solvent should preferably not itself react with the chlorinated silicon surface. The solvent may, for example, be a non-protic solvent. In one embodiment, the solvent is a Lewis base. Desirably, the solvent is liquid at 25° C. and atmospheric pressure and has a boiling point at atmospheric pressure of not more than 100° C. or more than 75° C. or more than 100° C., to facilitate removal of residual solvent from the silicon surface once the desired degree of reaction of the chlorinated silicon surface is achieved. Suitable solvents include, for example, ethers. The ether may, for example, be an aliphatic ether, in particular a cyclic ether such as tetrahydrofuran (THF). Other suitable ethers include, for example, dimethyl ether, diethyl ether, dioxane, and the like.

It will generally be desirable to carry out the contacting step between the chlorinated silicon surface and the ammonia in an environment free or essentially free of oxygen ($O_2$) and water, as this helps to ensure that the resulting —NH— terminated surface has a low level of contaminants and is highly uniform (i.e., essentially the entire silicon surface consists of Si—NH—Si functional groups). The ammonia and the solvent thus should be dry and the contacting step should be carried out under an inert atmosphere (that is, molecular oxygen should be excluded from the vessel or chamber within which the silicon material is contacted with the ammonia and solvent).

The mixture of ammonia and solvent is left in contact with the chlorinated silicon surface for a time effective to achieve the desired degree of conversion of Si—Cl to Si—NH—Si. Generally, such contact time will depend upon the reaction temperature, among other factors. However, the replacement of Cl atoms on the silicon surface typically proceeds at a reasonably rapid rate at about room temperature (e.g., 15-25° C.), such that contact times of from 30 minutes to two hours are generally sufficient. More broadly, contact temperatures of 0° C. to 50° C. and contact times of from five minutes to ten hours may, for example, be employed. The contacting may be conducted at any suitable pressure, such as atmospheric pressure. If the contact temperature selected is above room temperature, it may be desirable to carry out the contacting in a pressurizable vessel or container so as to avoid boiling off the ammonia.

The present invention is capable of providing silicon surfaces that are highly uniform and which predominantly or exclusively contain —Si—NH—Si— functional groups. The terminal —Si—NH—Si— groups may form a monolayer on the silicon substrate surface that is substantially or entirely free of other functional groups or contaminants. For example, at least about 80%, at least about 85%, at least about 90%, or at least about 95% of the Si atoms on the silicon surface may be part of an Si—NH—Si functional group.

Selectively terminated silicon surfaces are commonly used for silicon functionalization, both for model systems for fundamental studies and for practical applications in microelectronics, photovoltaics, and sensing. The —NH— termination provided by the present invention is capable of serving multiple purposes. The present invention makes possible surface functionalization schemes that do not lead to the formation of Si— or Si—C bonds, that often result in surface instability and susceptibility to oxidation, leading to the degradation of the interface. Instead, a strong Si—N surface bond is formed that can be used for further surface modification.

EXAMPLES

Samples of —NH— terminated silicon materials in accordance with the invention were prepared in accordance with the following procedure: In a 25 mL round bottom flask, 3 mL of $NH_3$ was condensed into 10 mL of dry THF. The resulting solution was stirred in a room temperature water bath under $N_2$. Cl-terminated Si wafers were added and stirred vigorously for 90 min.

To demonstrate that this sequence of steps had produced the desired termination, transmission infrared spectroscopy and X-ray photoelectron spectroscopy (XPS) were employed. These studies were supplemented with density functional calculations (DFT) employing a B3LYP/6-31+G (d,p) approach to predict experimental observables.

Figure 2:
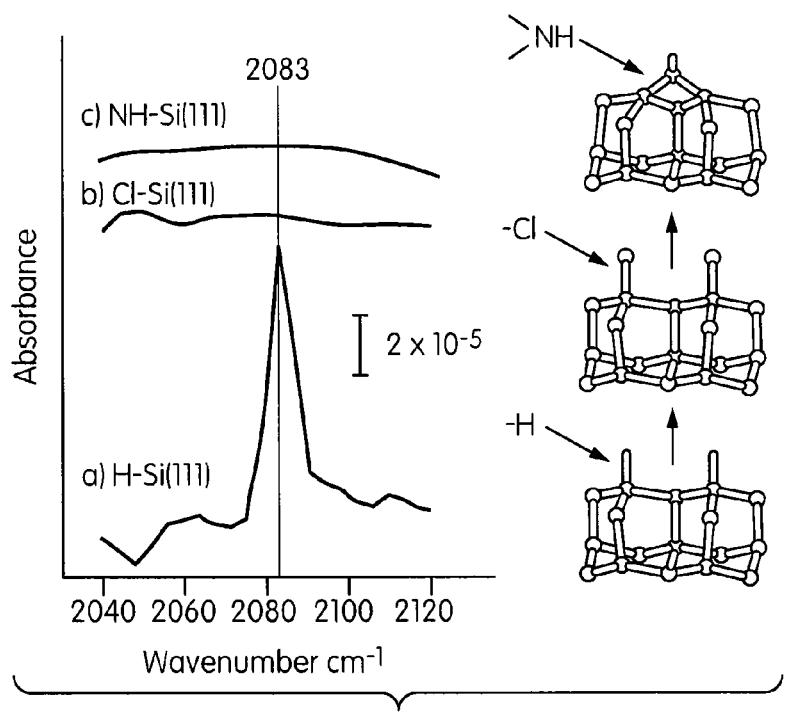
FIG. 2 shows certain transmission infrared spectroscopic results, as explained in the Examples.

FIG. 2 presents infrared investigations of the Si—H stretching region of the silicon samples following the modification steps.

The sharp Si—H stretching peak at 2083 $cm^{-1}$, a signature of a clean and well-ordered H—Si(111) surface shown in FIG. 2a disappears after chlorination (2b) and is still absent following modification with $NH_3$ in anhydrous THF. The rest of the spectral region collected for this non-float zone sample proved uninformative. Importantly, however, no clear signature of $NH_2$ bending modes was observed for sample (c) (consistent with further observations, vide infra). Very broad and weak stretching vibrations of —$NH_x$ species were observed around 3500 $cm^{-1}$ but these could not distinguish between Si—$NH_2$ and Si—NH—Si species.

Figure 3A:
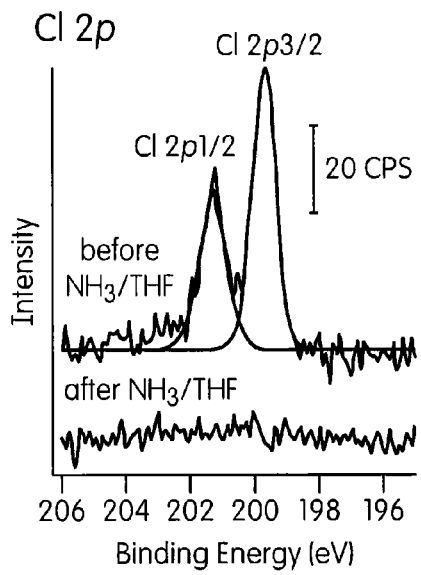
FIGS. 3a, 3b, 3c and 3d show XPS spectra of an Si(111) surface before and after ammonia/solvent treatment, in accordance with the invention.

In order to confirm the identity of the surface groups and quantify the concentrations of the species present on the silicon surface following each modification step, XPS was used to monitor N 1s, Cl 2s, Cl 2p, and Si 2p spectral regions. Survey spectra were also collected for each sample studied. Representative Cl 2p spectra of the Si(111) surface before and after ammonia modification are given in FIG. 3a. Since only one type of chlorine-containing species is present on the surface following the modification of the H—Si(111) sample with $PCl_5$ in the presence of benzoyl peroxide, as evidenced in FIG. 3a, and since the infrared signature of hydrogen present on this surface disappears following chlorination as shown in FIG. 2, it is reasonable to assume that a fully chlorinated Cl—Si(111) surface had been prepared following the second step outlined in FIG. 1. To confirm this assumption, quantitative analysis of the XPS spectra was performed according to Webb et al. *J. Phys. Chem. B*. 2005, 109, 3930-3937 (incorporated herein by reference in its entirety for all purposes). A very similar value of the corrected intensity ratio between Cl 1s and Si 2p was observed, corresponding to approximately 99% of the Si(111) surface sites occupied by chlorine atoms.

Figure 3B:
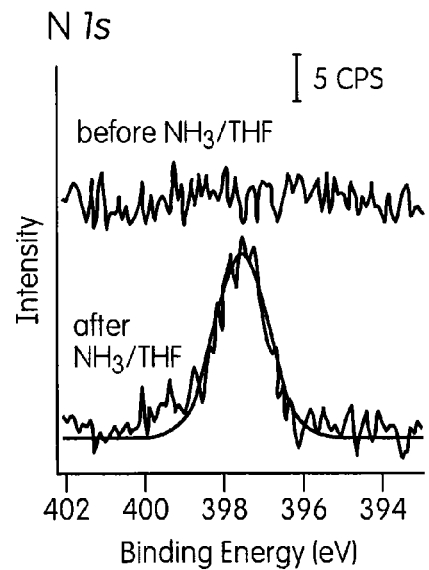

The single N 1s feature in FIG. 3b was concluded as indicating the Si—NH—Si functionality. The binding energy that corresponds to the observed feature was compared to the DFT predictions. The computational value of 398.2 eV for the model studied correlated well with the observed value of 397.6 eV. Even more importantly, any surface nitrogen oxidation would shift the observed peak by at least an eV towards higher binding energy. The assignment of the observed feature to Si—NH—Si, as opposed to Si—$NH_2$, is also based on a detailed study by Bishoff et al. (*Surf. Sci.* 1991, 251, 170) who observed a shift of N 1s feature from 398.6 eV for Si—$NH_2$ species to 398.0 eV for Si—NH—Si species on model surfaces in ultra-high vacuum. To further reinforce this assignment, quantitative analysis of the XPS spectra of the ammonia-modified silicon surface was performed. Comparison of the ratio of N 1s feature and Si 2p feature on the ammonia-treated surface with that of the Cl 2p feature and Si 2p feature on the Cl-covered Si(111) (where ~99% of the surface is covered with Cl atoms) and utilizing the calibration approach described by Haber et al. (*J. Phys. Chem. B* 2002, 106, 3639-3656), the nitrogen coverage on the ammonia-exposed surface was determined to be half that of chlorine on Cl—Si(111). The numbers based on repeated experiments with different samples yield 55±9% as a ratio of nitrogen coverage on a treated Si(111) surface and chlorine coverage on Cl—Si(111). It should again be emphasized that according to the XPS data, all the chlorine is removed following ammonia treatment. Thus, in an exchange reaction, one Si—NH—Si group replaces two Si—Cl groups, consistent with the reaction scheme outlined in FIG. 1.

Figure 3C:
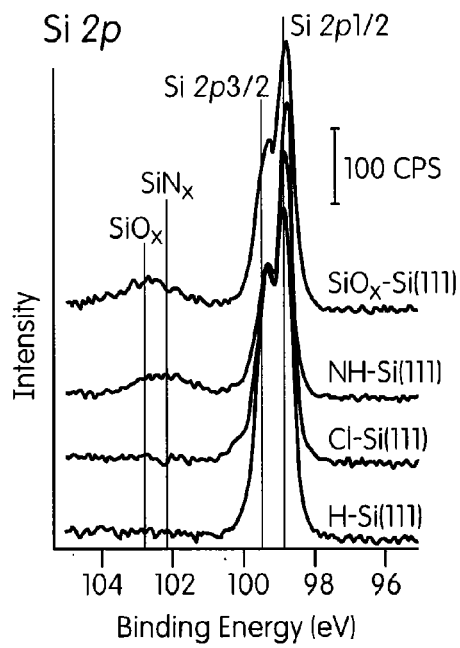
Figure 3D:
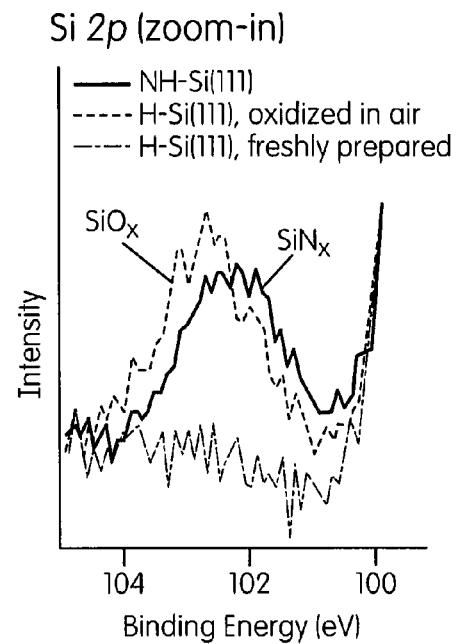

The analysis of the Si 2p spectrum in FIG. 3c further reaffirms these conclusions. There is no observable silicon surface oxidation during the experimental procedure used to obtain the H-terminated and Cl-terminated Si(111) substrates. A spectrum obtained following $NH_3$/THF exposure exhibits a small feature at 102.2 eV in addition to the familiar signatures of the clean silicon surface. This feature corresponds to the $SiN_x$ surface species. Although it could not be completely ruled out that it encompasses both surface $SiO_x$ and $SiN_x$ species, quantitative analysis based on the approach described by Haber et al. (J. Phys. Chem. B 2002, 106, 3639-3656) suggests that if one assumes that all of this intensity corresponds to Si—N-containing species, this would correspond to a single monolayer of Si—NH—Si species shown in FIG. 1. The data analysis yields 90±8% in coverage for this step. To reassure that the spectroscopic signature of the surface nitrogen-containing species within the Si 2p spectral region is different from the species resulting from surface oxidation, FIG. 3d zooms in on the spectral portion of the Si 2p region corresponding to surface oxides and nitrides. Clearly, the $SiO_x$ species observed around 103 eV following H—Si(111) surface oxidation in ambient are different from the $SiN_x$ species observed at 102.2 eV following $NH_3$/THF treatment of the Cl—Si(111) surface. The surface obtained by the $NH_3$/THF treatment is stable in the vacuum of the XPS instrument or for several days in anhydrous THF. On exposure to ambient conditions it does show oxidation.

What is claimed is:

1. A silicon material having a silicon surface, wherein the silicon surface contains Si—NH—Si functionality, at least about 80% of the Si atoms on the silicon surface are part of an Si—NH—Si functional group, the Si—NH—Si functional groups form a monolayer on the silicon surface, and the silicon surface is stable for several days in anhydrous tetrahydrofuran under nitrogen.

2. The silicon material of claim 1, wherein the silicon surface is a Si(111) single crystalline surface.

3. The silicon material of claim 1, wherein at least about 90% of the Si atoms on the silicon surface are part of an Si—NH—Si functional group.

4. A method of manufacturing a silicon material, comprising contacting a chlorinated silicon surface with ammonia and a solvent to produce a silicon material having a silicon surface, wherein the silicon surface contains Si—NH—Si functionality, at least about 80% of the Si atoms on the silicon surface are part of an Si—NH—Si functional group, the Si—NH—Si functional groups form a monolayer on the silicon surface, and the silicon surface is stable for several days in anhydrous tetrahydrofuran under nitrogen.

5. The method of claim 4, wherein the silicon surface is an Si(111) single crystalline surface.

6. The method of claim 4, wherein the contacting is carried out in the substantial absence of $O_2$.

7. The method of claim 4, wherein the contacting is carried out in the substantial absence of water.

8. The method of claim 4, wherein the contacting is carried out in the substantial absence of both $O_2$ and water.

9. The method of claim 4, wherein the solvent is an ether.

10. The method of claim 9, wherein the ether is an aliphatic ether.

11. The method of claim 9, wherein the ether is a cyclic ether.

12. The method of claim 9, wherein the ether is tetrahydrofuran.

13. The method of claim 4, wherein the contacting is carried out using ammonia-saturated tetrahydrofuran.

14. The method of claim 4, wherein the contacting is carried out for a period of time of from five minutes to ten hours at a temperature of from 0° C. to 50° C.

15. The method of claim 4, wherein the chlorinated silicon surface has been obtained by reacting an H-terminated Si(111) surface with a chlorine-containing compound.

16. The method of claim 15, wherein the chlorine-containing compound is $PCl_5$.

* * * * *

UNITED STATES PATENT AND TRADEMARK OFFICE
CERTIFICATE OF CORRECTION

PATENT NO. : 9,272,914 B2  
APPLICATION NO. : 13/989479  
DATED : March 1, 2016  
INVENTOR(S) : Fangyuan Tian, Douglass F. Taber and Andrew V. Teplyakov Page 1 of 1

It is certified that error appears in the above-identified patent and that said Letters Patent is hereby corrected as shown below:

On the Title Page, item (54), the Title should read -- AN -NH- TERMINATED SILICON SURFACE AND A METHOD FOR ITS PREPARATION --

Specification  
At Column 1, before the heading, "Statement Regarding Federal Funding", the Title should read  
-- AN -NH- TERMINATED SILICON SURFACE AND A METHOD FOR ITS PREPARATION --

Signed and Sealed this  
Third Day of May, 2016

Michelle K. Lee  
*Director of the United States Patent and Trademark Office*